(12) United States Patent
Huang et al.

(10) Patent No.: US 9,754,813 B2
(45) Date of Patent: Sep. 5, 2017

(54) BOND CHUCK, METHODS OF BONDING, AND TOOL INCLUDING BOND CHUCK

(71) Applicant: Taiwan Semiconductor Manufacturing Company, Ltd., Hsin-Chu (TW)

(72) Inventors: Chih-Hui Huang, Yongkang (TW);
Yen-Chang Chu, Tainan (TW);
Kuan-Liang Liu, Pingtung (TW);
Ping-Yin Liu, Yonghe (TW);
Cheng-Yuan Tsai, Chu-Pei (TW);
Yeur-Luen Tu, Taichung (TW);
Chia-Shiung Tsai, Hsin-Chu (TW);
Ru-Liang Lee, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/341,769

(22) Filed: Nov. 2, 2016

(65) Prior Publication Data
US 2017/0053823 A1 Feb. 23, 2017

Related U.S. Application Data

(62) Division of application No. 14/592,788, filed on Jan. 8, 2015, now Pat. No. 9,490,158.

(51) Int. Cl.
| H01L 21/687 | (2006.01) |
| H01L 21/67 | (2006.01) |
| H01L 21/683 | (2006.01) |
| B32B 37/10 | (2006.01) |

(Continued)

(52) U.S. Cl.
CPC .... *H01L 21/68785* (2013.01); *B32B 37/1018* (2013.01); *H01L 21/67092* (2013.01); *H01L 21/68* (2013.01); *H01L 21/6838* (2013.01); *H01L 21/68735* (2013.01); *H01L 24/75* (2013.01); *B32B 2457/14* (2013.01);
(Continued)

(58) Field of Classification Search
CPC combination set(s) only.
See application file for complete search history.

(56) References Cited

U.S. PATENT DOCUMENTS

| 4,298,273 A | 11/1981 | Nishizuka et al. |
| 5,129,827 A | 7/1992 | Hoshi et al. |
| 5,273,553 A | 12/1993 | Hoshi et al. |

(Continued)

FOREIGN PATENT DOCUMENTS

| JP | H0794675 A | 4/1995 |
| JP | 2005043871 A | 2/2005 |

(Continued)

*Primary Examiner* — Mamadou Diallo
(74) *Attorney, Agent, or Firm* — Slater Matsil, LLP (57) ABSTRACT

A bonding chuck is discussed with methods of using the bonding chuck and tools including the bonding chuck. A method includes loading a first wafer on first surface of a first bonding chuck, loading a second wafer on a second bonding chuck, and bonding the first wafer to the second wafer. The first surface is defined at least in part by a first portion of a first spherical surface and a second portion of a second spherical surface. The first spherical surface has a first radius, and the second spherical surface has a second radius. The first radius is less than the second radius.

20 Claims, 8 Drawing Sheets

(51) Int. Cl.
*H01L 21/68* (2006.01)
*H01L 23/00* (2006.01)

(52) U.S. Cl.
CPC .............. *H01L 2224/757* (2013.01); *H01L 2224/75983* (2013.01)

(56) References Cited

U.S. PATENT DOCUMENTS

| | | |
|---|---|---|
| 5,500,540 A | 3/1996 | Jewell et al. |
| 6,032,997 A | 3/2000 | Elliott et al. |
| 6,892,769 B2 | 5/2005 | Hong |
| 7,435,311 B1 | 10/2008 | Marzen et al. |
| 7,479,441 B2 | 1/2009 | Kirk et al. |
| 7,980,287 B2 | 7/2011 | Hwang |
| 8,307,543 B2 | 11/2012 | Lee |
| 8,575,002 B2 | 11/2013 | Broekaart et al. |
| 9,040,334 B2 | 5/2015 | Chu et al. |
| 2004/0018803 A1 | 1/2004 | Boumerzoug et al. |
| 2005/0018122 A1 | 1/2005 | Hong |
| 2006/0292822 A1 | 12/2006 | Xie |
| 2010/0097738 A1 | 4/2010 | Kang et al. |
| 2010/0139836 A1 | 6/2010 | Horikoshi |
| 2010/0248446 A1 | 9/2010 | Liu et al. |
| 2012/0006463 A1 | 1/2012 | Gaudin |
| 2012/0024456 A1 | 2/2012 | Lin et al. |
| 2012/0186741 A1 | 7/2012 | Lake |
| 2012/0193009 A1 | 8/2012 | Fujii |
| 2013/0101372 A1* | 4/2013 | Tschinderle ...... H01L 21/67126 414/217 |
| 2013/0256824 A1 | 10/2013 | Mizuta et al. |
| 2014/0261960 A1 | 9/2014 | Lin et al. |
| 2015/0210057 A1 | 7/2015 | Wagenleithner et al. |
| 2015/0214082 A1 | 7/2015 | Huang et al. |

FOREIGN PATENT DOCUMENTS

| | | |
|---|---|---|
| JP | 5107911 B2 | 10/2012 |
| JP | 2013258377 A | 12/2013 |
| KR | 20100043478 A | 4/2010 |
| KR | 20160015133 A | 2/2016 |
| TW | I244433 B | 12/2005 |
| TW | 200913815 A | 3/2009 |
| TW | 201225194 A | 6/2012 |
| TW | 201324629 A | 6/2013 |
| TW | 201436068 A | 9/2014 |
| WO | 2014191033 A1 | 12/2014 |

\* cited by examiner

BOND CHUCK, METHODS OF BONDING, AND TOOL INCLUDING BOND CHUCK

PRIORITY CLAIM AND CROSS-REFERENCE

This application is a divisional of U.S. patent application Ser. No. 14/592,788, filed on Jan. 8, 2015, entitled "Bond Chuck, Methods of Bonding, and Tool Including Bond Chuck," which application is hereby incorporated herein by reference in its entirety.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as for lower power consumption and latency, has grown recently, there has grown a need for smaller and more creative techniques for forming semiconductor structures.

As semiconductor technologies further advance, stacked semiconductor devices, e.g., 3D integrated circuits (3DIC), have emerged as an effective alternative to further reduce the physical size of a semiconductor device. In a stacked semiconductor device, active circuits such as logic, memory, processor circuits, and the like are fabricated on different semiconductor wafers. Two or more semiconductor wafers may be installed on top of one another to further reduce the form factor of the semiconductor device. The stacked semiconductor devices may provide a higher density with smaller form factors and allow for increased performance and lower power consumption. Further, by stacking semiconductor devices, circuits can be formed on one semiconductor wafer by processes that are incompatible with circuits formed and/or processes performed on another semiconductor wafer, and vice versa.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "top," "bottom," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments are discussed below in a specific context, namely wafer bonding. Some specific examples are provided in which device and/or carrier wafers are bonded. However, aspects of this disclosure may be applied in numerous other contexts, such as to wafer bonding to achieve a semiconductor-on-insulator (SOI) wafer, a strained semiconductor virtual substrate, or the like. Further, some modifications to processes and systems are discussed below, and one of ordinary skill in the art will readily understand additional modifications that can be applied. Embodiments contemplate these modifications. Further, although some methods are described in a particular order, some embodiments contemplate methods performed in any logical order.

Figure 1:
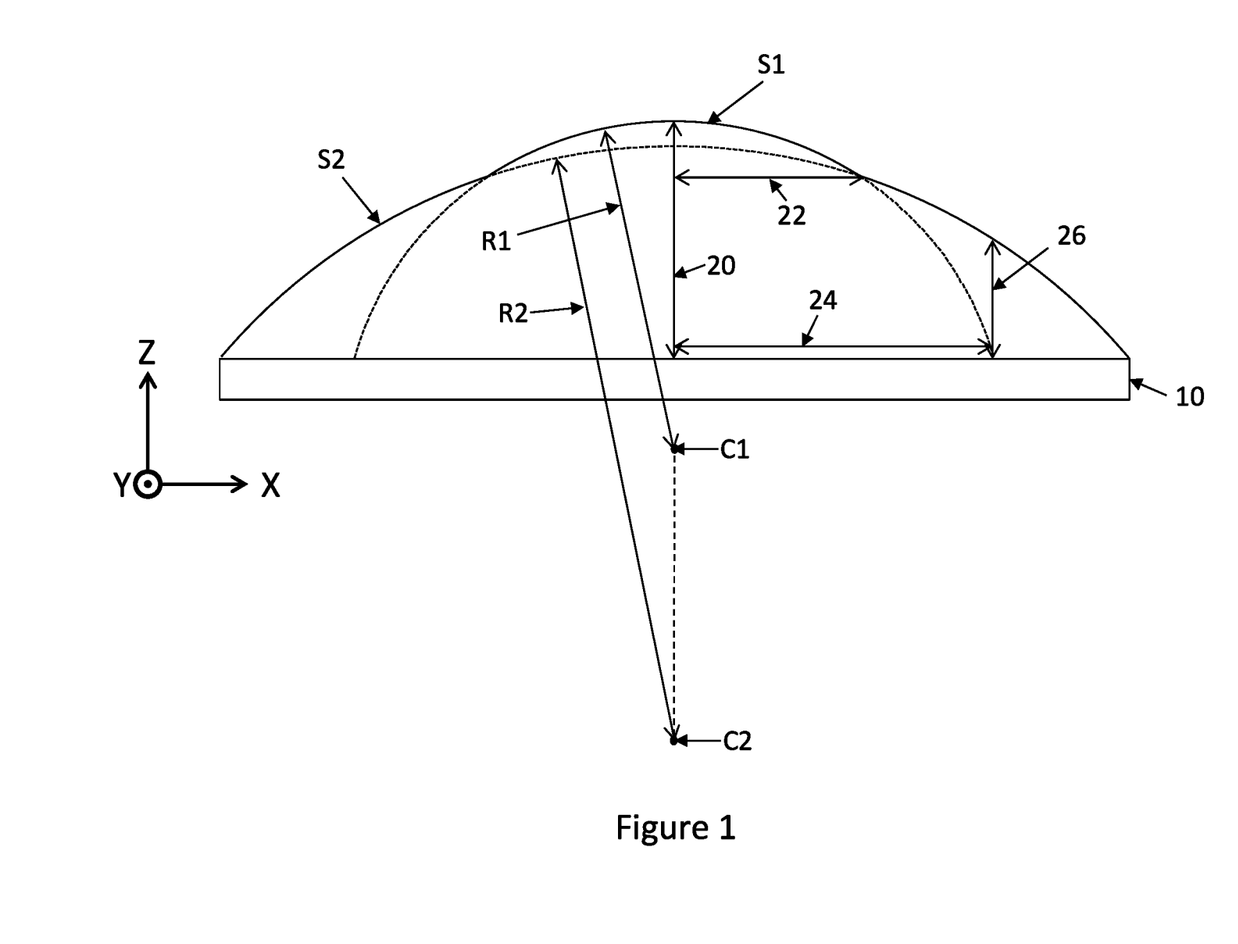
FIG. 1 is a cross section of a multi-curvature bonding chuck in accordance with some embodiments.

FIG. 1 illustrates example geometric properties of a cross section of a multi-curvature bonding chuck in accordance with some embodiments. Some of these properties may be exaggerated and/or not proportional in FIG. 1 and subsequent figures to clearly convey aspects of the illustrated embodiments. A surface of the bonding chuck is convex and includes portions of surfaces of two spheres having different radii. In subsequent discussion, a portion of a surface of a sphere may be referred to as a "spherical surface;" however, this alone does not necessarily connote that an entire surface of a sphere is included. A first spherical surface S1 has a first radius R1 from a first center C1, and a second spherical surface S2 has a second radius R2 from a second center C2. The first radius R1 is less than the second radius R2. The first center C1 and the second center C2 align in a direction perpendicular to the planar chuck base 10, e.g., in a Z-direction. The first center C1 is positioned relative to the second center C2 such that the first spherical surface S1 protrudes from the second spherical surface S2 in a Z-direction at a center line 20 of the spherical surfaces S1 and S2. The first spherical surface S1 is in a center portion of the second spherical surface S2 on the bonding chuck. In practice, the bonding chuck may deviate from these spherical surfaces S1 and S2 proximate a joint transitioning from the first spherical surface S1 to the second spherical surface S2 to allow for a smooth transition, for example. Other cross sections of the bonding chuck intersecting the center line 20 of the surfaces may be identical to the cross section of FIG. 1.

Example dimensions of the bonding chuck, such as for bonding 300 mm wafers, are provided below. One of ordinary skill in the art will readily understand that the dimensions can be varied, which is contemplated within the scope of other embodiments. The first radius R1 is about 90 m, and the second radius R2 is about 200 m. At a center of the surface of the multi-curvature bonding chuck, an apex height at the center line 20 from the planar chuck base 10 to the center of the first spherical surface S1 is between about 100 µm and about 125 µm. A distance 22 in an X-Y plane from the center line 20 to a junction of the first spherical surface S1 and the second spherical surface S2 is about 60 mm. A distance 24 in an X-Y plane from the center line 20 to a junction of the first spherical surface S1 and the planar chuck base 10 is about 150 mm. At this junction of the first spherical surface S1 and the planar chuck base 10, a distance 26 in a Z-direction to the second spherical surface S2 is between about 20 µm and about 45 µm.

An appropriate vendor can manufacture and provide a bonding chuck having a multi-curvature surface as described herein. For example, EV Group, headquartered in Austria, can provide such a bonding chuck.

Figure 2A:
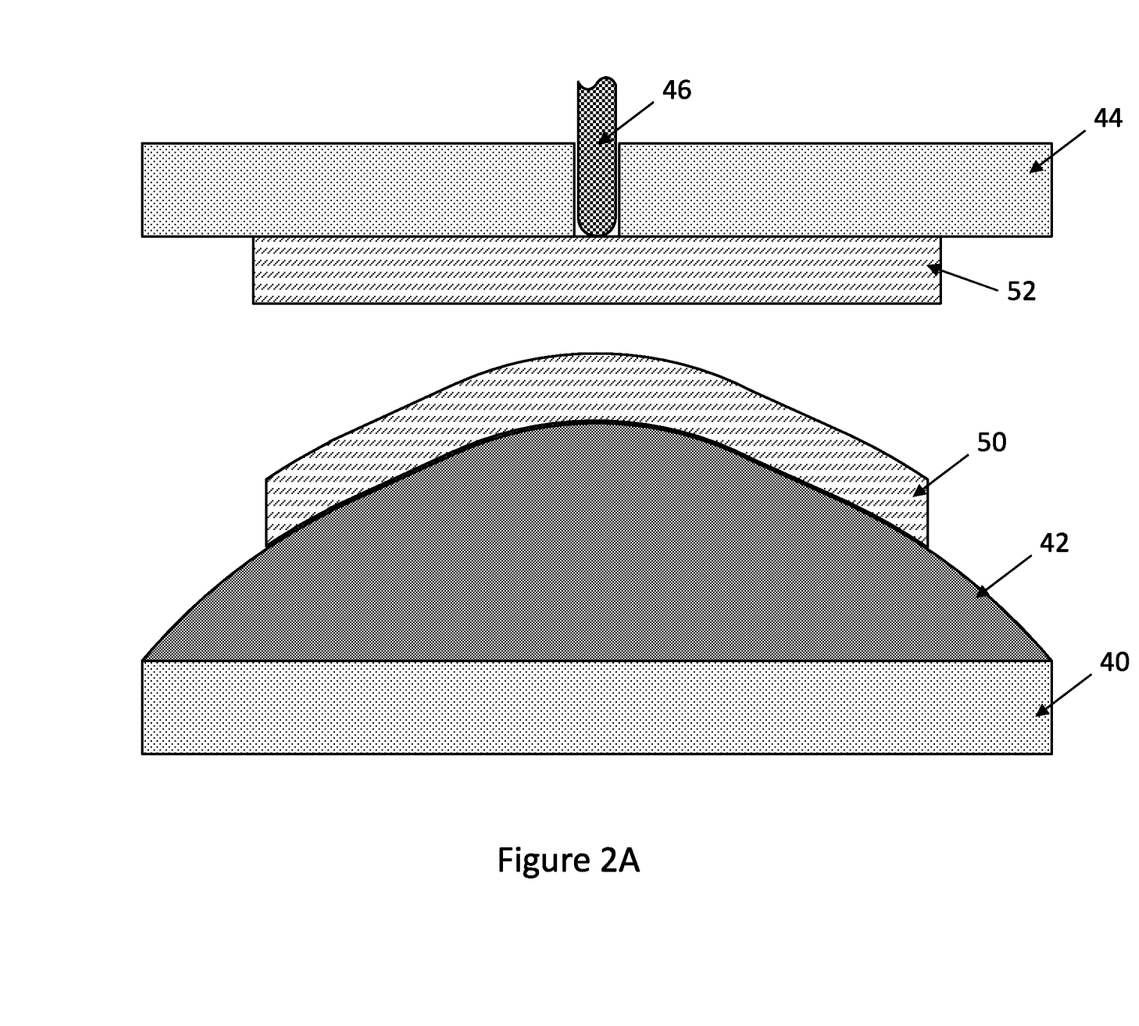
FIGS. 2A through 2C are various steps for wafer bonding using a multi-curvature bonding chuck in accordance with some embodiments.
Figure 2B:
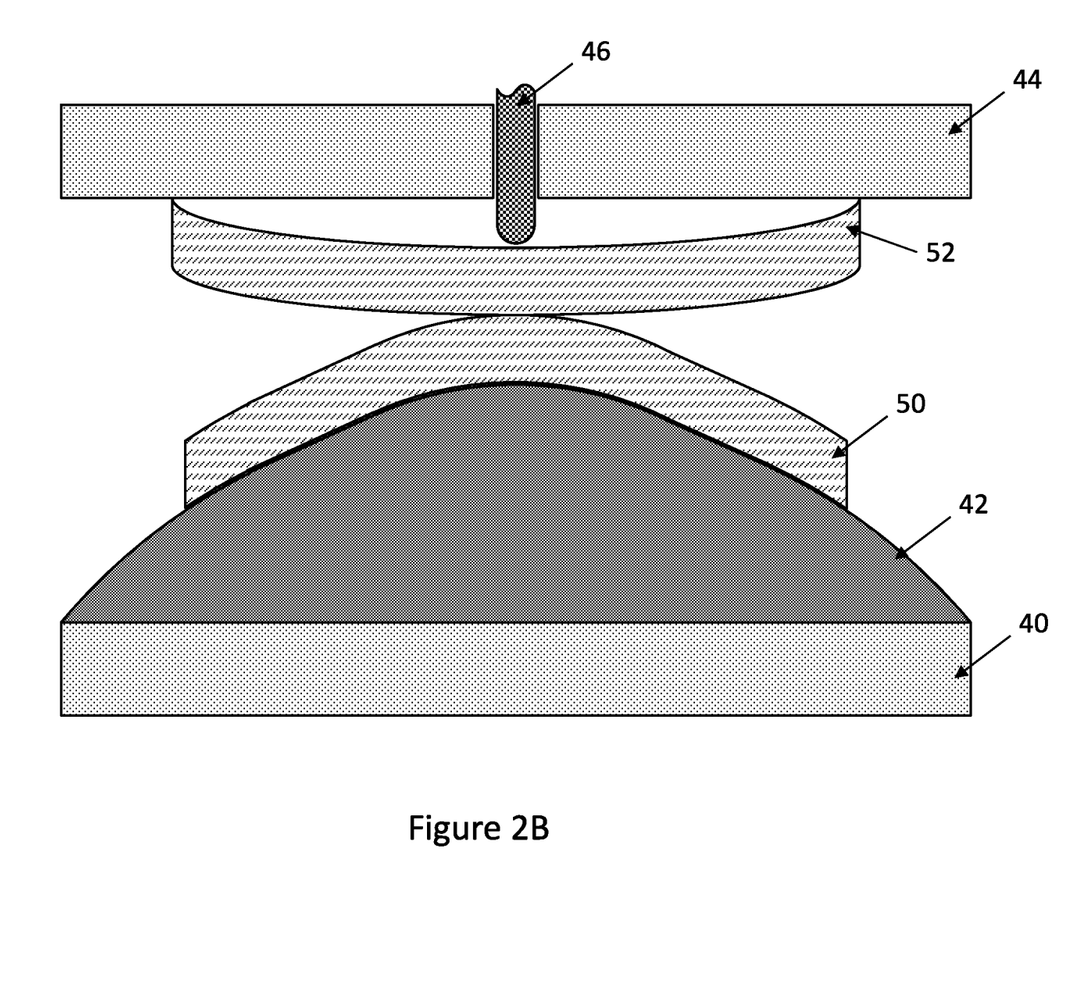
Figure 2C:
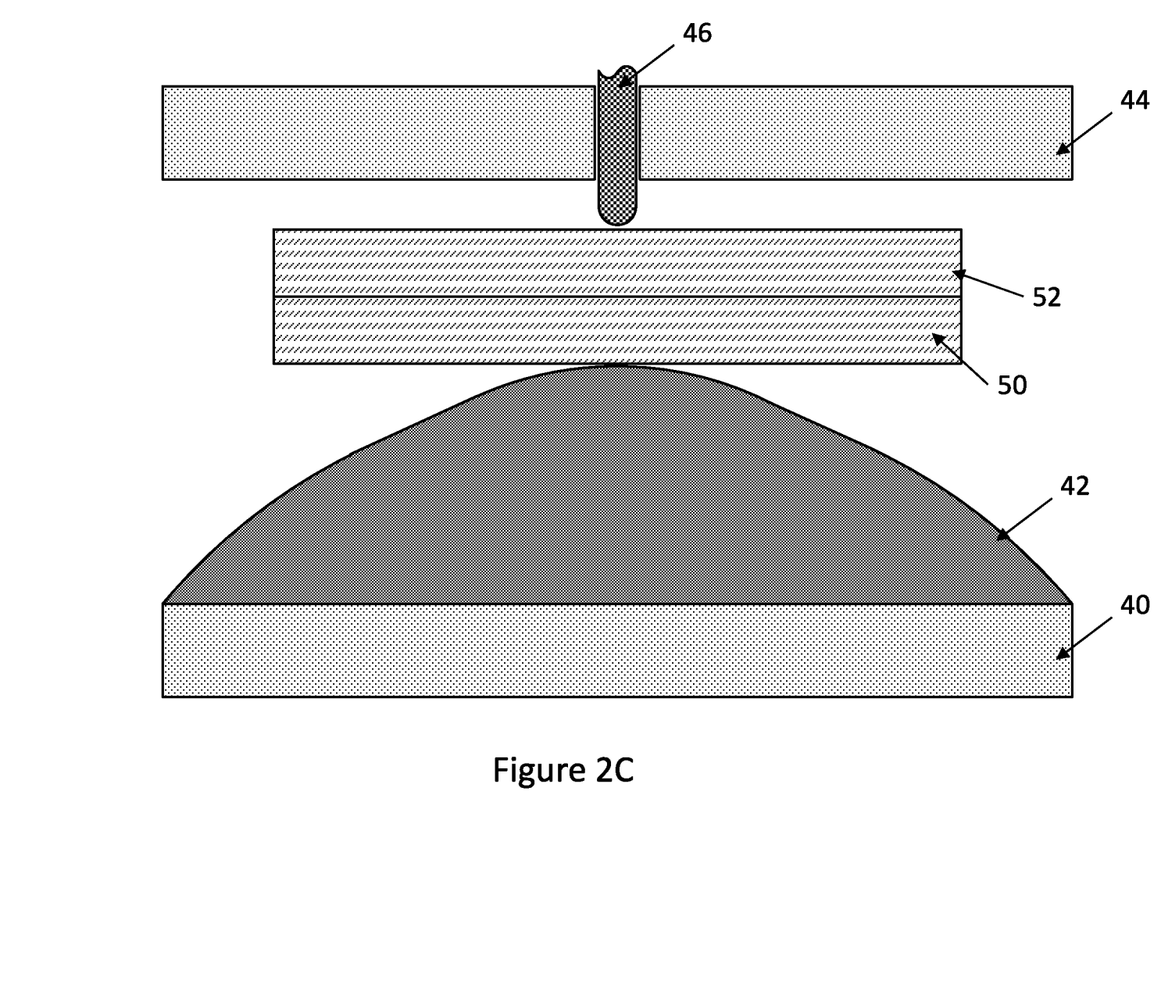

FIGS. 2A through 2C illustrate various steps in wafer bonding using a multi-curvature bonding chuck. FIG. 2A illustrates a bottom bonding chuck 40 having a multi-curvature bonding surface 42, such as discussed in FIG. 1, and a top bonding chuck 44 with a bonding pin 46 in a retracted position. A first wafer 50 is on the multi-curvature bonding surface 42 of the bottom bonding chuck 40, and a second wafer 52 is on the top bonding chuck 44.

The first wafer 50 and the second wafer 52 can be any type of wafer. For example, each of the first wafer 50 and the second wafer 52 can be a wafer comprising logic dies, system-on-chip (SOC) dies, application specific integrated circuit (ASIC) dies, image sensor dies, memory dies, or the like. In an example, the first wafer 50 is a wafer comprising SOC dies, and the second wafer 52 is a wafer comprising ASIC dies. In another example, the first wafer 50 is a wafer comprising logic dies, and the second wafer 52 is a wafer comprising image sensor dies.

The first wafer 50 and the second wafer 52 can be prepared for bonding using any acceptable process. Then, the first wafer 50 is placed and secured on the multi-curvature bonding surface 42. A vacuum system may be coupled to the bottom bonding chuck 40 and may be used to secure the first wafer 50. For example, many small holes or perforations may be in the multi-curvature bonding surface 42 such that a pressure differential may be applied to a back (e.g., non-bonding) surface of the first wafer 50. The first wafer 50 may be secured to the bottom bonding chuck 40 such that the first wafer 50 conforms to the multi-curvature bonding surface 42, which may be an elastic deformation. For example, when a vacuum system is used, a suction or pressure differential applied to the back (e.g., non-bonding) surface of the first wafer 50 may cause the first wafer 50 to conform to the multi-curvature bonding surface 42. Similarly, the second wafer 52 is placed and secured on the top bonding chuck 44. A vacuum system may be coupled to the top bonding chuck 44 and may be used to secure the second wafer 52. For example, many small holes or perforations may be in a surface of the top bonding chuck 44 to which the second wafer 52 will be secured such that a pressure differential may be applied to a back (e.g., non-bonding) surface of the second wafer 52. In some embodiments, the vacuum system is turned on, and subsequently, the second wafer 52 is placed on the top bonding chuck 44. With the vacuum system turned on, the second wafer 52 may be secured to the top bonding chuck 44, for example, even if the surface of the top bonding chuck 44 to which the second wafer 52 is secured is facing downwardly. The top bonding chuck 44 can be positioned above the bottom bonding chuck 40 with the bonding surfaces of the first wafer 50 and the second wafer 52 facing each other.

In FIG. 2B, the bonding pin 46 extends from the top bonding chuck 44 causing the second wafer 52 to deform and causing the bonding surfaces of the first wafer 50 and the second wafer 52 to contact. The first wafer 50 and the second wafer 52 first contact while the first wafer 50 is secured and conforms to the multi-curvature bonding surface 42. Further, the first wafer 50 and the second wafer 52 first contact while the second wafer 52 is secured to the top bonding chuck 44 and is deformed by the extension of and force from the bonding pin 46. Accordingly, the first wafer 50 and the second wafer 52 are initially contacted while both the first wafer 50 and the second wafer 52 are deformed, such as by an elastic deformation. The first wafer 50 and the second wafer 52 can be held in contact in this position for a period of time, such as between about 5 seconds and 10 seconds. In this manner, the contacting portions of the first wafer 50 and the second wafer 52 (e.g., generally the respective centers of the bonding surfaces of the first wafer 50 and the second wafer 52) may initiate bonding, such as through chemical reactions (e.g., to form covalent and/or ionic bonds) and/or atomic attractive forces (e.g., such as polar forces and/or hydrogen bonding). Once bonding is initiated, a bond wave may propagate between the bonding surfaces outwardly.

In FIG. 2C, the first wafer 50 is released from the bottom bonding chuck 40, and the second wafer 52 is released from the top bonding chuck 44. For example, the suction or pressure differential caused by respective vacuum systems may be removed. Once the first wafer 50 and the second wafer 52 are released, each of the first wafer 50 and the second wafer 52 may return to its natural form, such as a planar wafer. Additionally, the bond wave initiated, as discussed with respect to FIG. 2B, may continue to propagate outwardly causing reactions and/or atomic attractive forces to occur between remaining portions of the bonding surfaces of the first wafer 50 and the second wafer 52. By contacting the bonding surfaces in generally center areas and having a bond wave propagate outwardly, voids and/or gas pockets can typically be avoided at the bonding interface between the bonding surfaces of the first wafer 50 and the second wafer 52.

Figure 3:
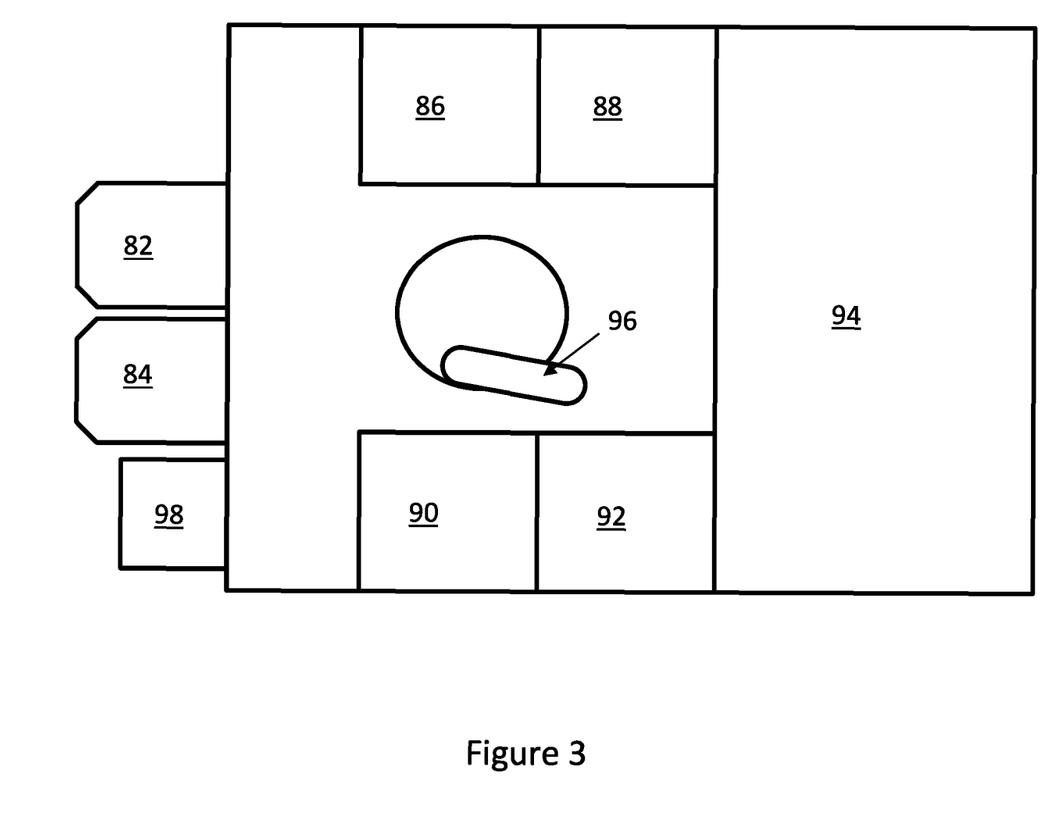
FIG. 3 is an example bonding tool in accordance with some embodiments.

FIG. 3 illustrates an example bonding tool in accordance with some embodiments. The bonding tool of FIG. 3 comprises a first load port 82, a second load port 84, a first module 86, a second module 88, a third module 90, a fourth module 92, a bonding module 94, a robot assembly 96, and a control module 98. Each of the first load port 82 and the second load port 84 can be a front opening unified pod (FOUP) from which the robot assembly 96 can receive and/or to which the robot assembly 96 can load various wafers. The robot assembly 96 is configured to transfer wafers among any of the first module 86, the second module 88, the third module 90, the fourth module 92, and the bonding module 94. The first module 86, the second module 88, the third module 90, and the fourth module 92 may be any acceptable module, such as modules configured to prepare wafers for bonding. The control module 98 may be, e.g., a workstation computer that is capable of implementing a recipe for controlling the operation of the bonding tool, including each module. The control module 98 may comprise one or more electronic controllers and/or processors that control an automated process of the bonding tool, such as in accordance with a recipe supplied by memory (e.g., a non-transitory medium) in the control module 98 or remote from the bonding tool.

Figure 4A:
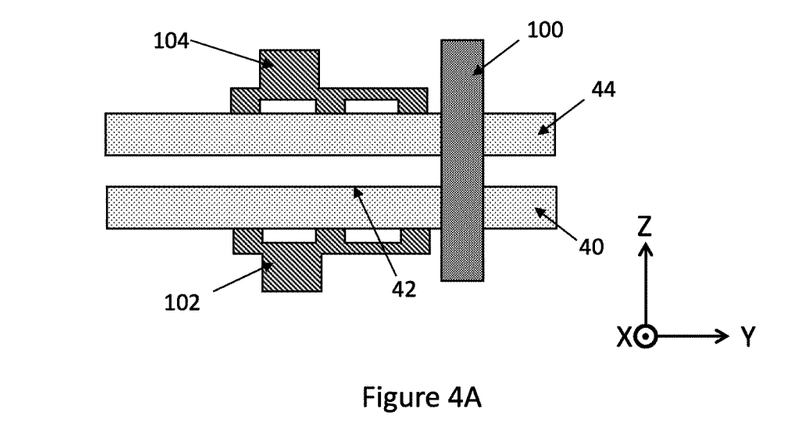
FIGS. 4A, 4B, and 5 through 9 illustrate components and operation of a bonding module of a bonding tool in accordance with some embodiments.

FIGS. 4A, 4B, and 5 through 9 illustrate components and operation of the bonding module 94 in accordance with some embodiments. FIG. 4A illustrates a view of a bottom bonding chuck 40 and a top bonding chuck 44 from an X-direction. The bottom bonding chuck 40 has a multi-curvature bonding surface 42 as discussed in FIGS. 1 and 2A through 2C. Although not explicitly illustrated, the top bonding chuck 44 has a bonding pin 46, as discussed in FIGS. 1 and 2A through 2C. An optical alignment measurement system 100 is disposed proximate the bottom bonding chuck 40 and the top bonding chuck 44, which will be discussed in further detail in FIG. 4B. A first vacuum system 102 is disposed on a backside of the bottom bonding chuck 40 (e.g., opposite from the side where the first wafer 50 will be loaded). A second vacuum system 104 is disposed on a backside of the top bonding chuck 44 (e.g., opposite from the side where the second wafer 52 will be loaded). The first vacuum system 102 and the second vacuum system 104 may comprise various hoses or the like to couple a vacuum pump to the respective bottom bonding chuck 40 and the top bonding chuck 44. The hoses can couple openings that extend to the surfaces of the respective bottom bonding chuck 40 and the top bonding chuck 44 on which wafers will be loaded, such as the multi-curvature bonding surface 42 of the bottom bonding chuck 40.

Figure 4B:
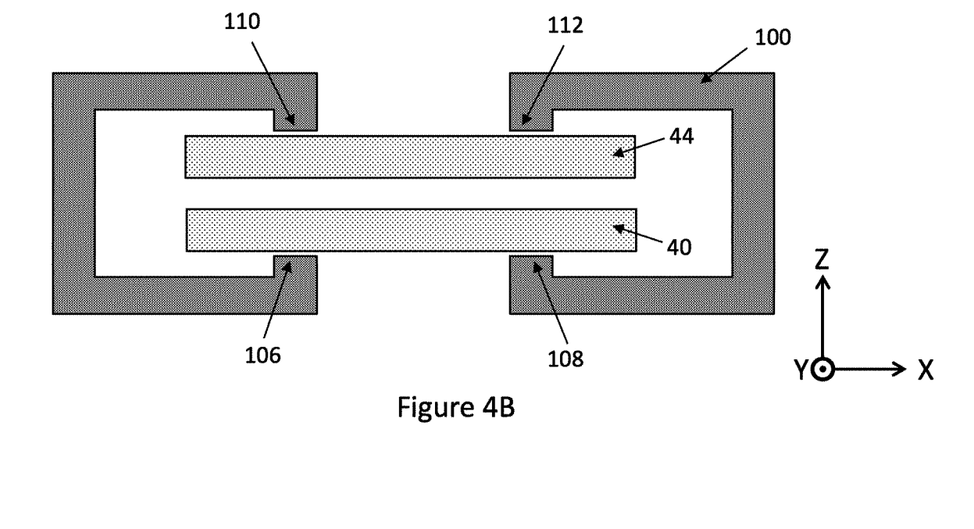

FIG. 4B illustrates additional features of the bottom bonding chuck 40, the top bonding chuck 44, and the optical alignment measurement system 100. The optical alignment measurement system 100 includes microscopes 106, 108, 110, and 112. Bottom microscopes 106 and 108 are disposed from the backside of the bottom bonding chuck 40. Top microscopes 110 and 112 are disposed from the backside of the top bonding chuck 44. The optical alignment measurement system 100 may be the SmartView alignment system available from EV Group, headquartered in Austria.

Figure 5:
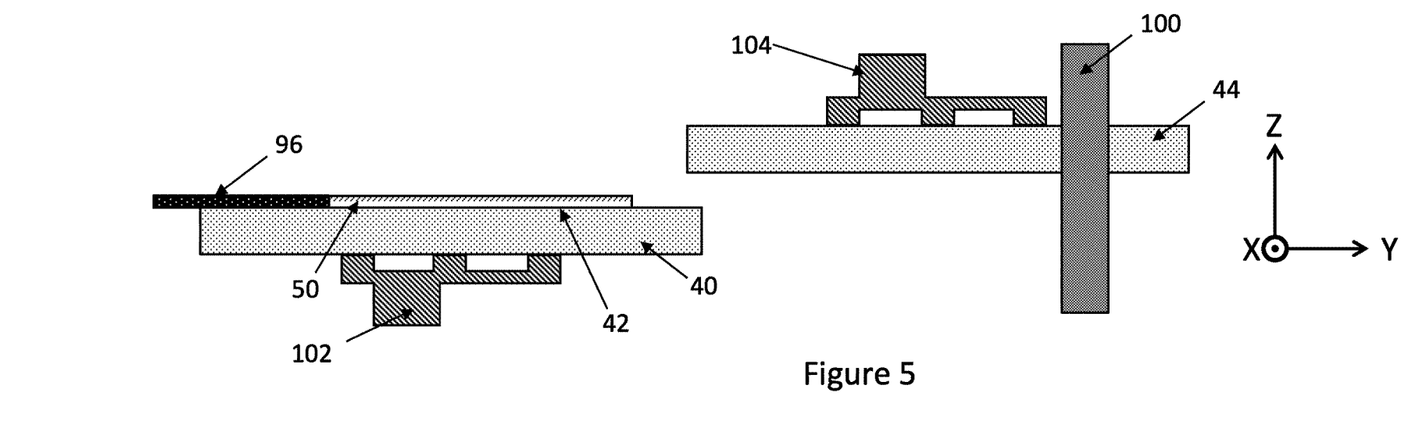
Figure 6:
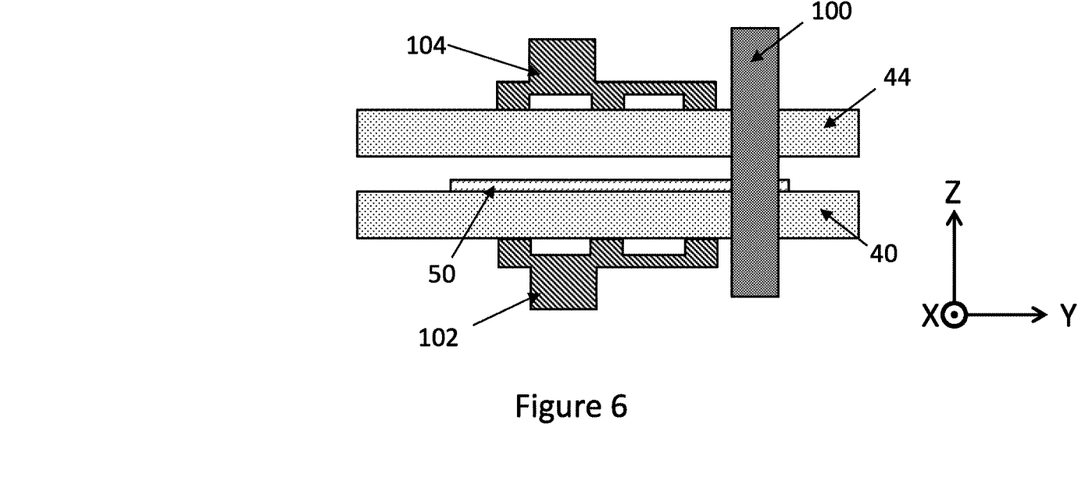

In FIG. 5, a first wafer 50 is loaded on the bottom bonding chuck 40. The bottom bonding chuck 40 is first translated away from the top bonding chuck 44, e.g., in a Y-direction as illustrated, to ease loading of the first wafer 50. The translation may be by tracks powered by a motor, by a screw shaft driven by a motor, or the like. The robot assembly 96 may then place the first wafer 50 on the upward facing surface, e.g., the multi-curvature bonding surface 42, of the bottom bonding chuck 40. The first vacuum system 102 is then turned on such that the first wafer 50 is secured to the bottom bonding chuck 40 and conforms to the multi-curvature bonding surface 42, as discussed with respect to FIG. 2A. Prior to loading the first wafer 50 on the bottom bonding chuck 40, the first wafer 50 may be transferred to and/or from one or more of the first module 86, the second module 88, the third module 90, and the fourth module 92 in preparation for bonding. In FIG. 6, the bottom bonding chuck 40, with the first wafer 50 thereon, is translated, such as by tracks powered by a motor, by a screw shaft driven by a motor, or the like, back to be in view of the optical alignment measurement system 100.

Figure 7:
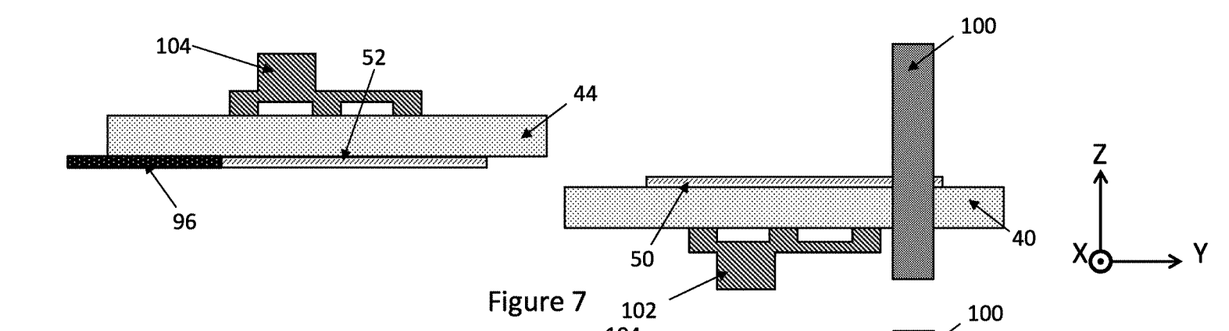
Figure 8:
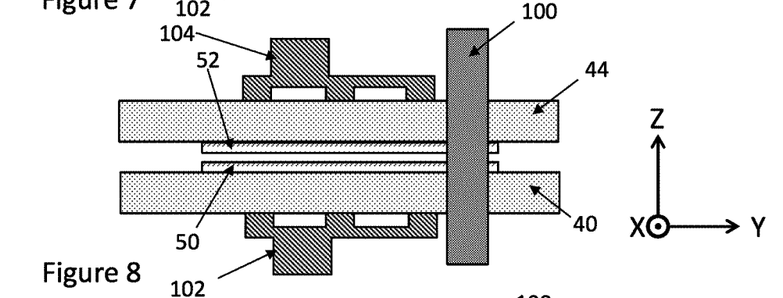

In FIG. 7, a second wafer 52 is loaded on the top bonding chuck 44. The top bonding chuck 44 is first translated away from the bottom bonding chuck 40, e.g., in a Y-direction as illustrated, to ease loading of the second wafer 52. The translation may be by tracks powered by a motor, by a screw shaft driven by a motor, or the like. The second vacuum system 104 is then turned on. The robot assembly 96 may then place the second wafer 52 on the downward facing surface of the top bonding chuck 44. The second vacuum system 104 secures the second wafer 52 to the top bonding chuck 44, as discussed with respect to FIG. 2A. Prior to loading the second wafer 52 on the top bonding chuck 44, the second wafer 52 may be transferred to and/or from one or more of the first module 86, the second module 88, the third module 90, and the fourth module 92 in preparation for bonding. In FIG. 8, the top bonding chuck 44, with the second wafer 52 thereon, is translated, such as by tracks powered by a motor, by a screw shaft driven by a motor, or the like, back to be in view of the optical alignment measurement system 100.

The optical alignment measurement system 100 may then be used to align the first wafer 50 and the second wafer 52 for bonding. Various motors, such as stage motors, can drive each of the bottom bonding chuck 40 and the top bonding chuck 44 in an X-direction and a Y-direction for fine tuning of alignment of the first wafer 50 and the second wafer 52 for bonding. Further, other motors, such as software compensated spindle motors, can drive the top bonding chuck 44 around a Z-axis to rotate the second wafer 52 into alignment with the first wafer 50 for bonding.

The alignment process may use the SmartView alignment system to align the first wafer 50 and the second wafer 52. First, the first wafer 50 on the bottom bonding chuck 40 is positioned to be viewed by the optical alignment measurement system 100, and the top bonding chuck 44 is retracted to not obscure the view of the optical alignment measurement system 100. The first wafer 50 on the bottom bonding chuck 40 is then observed by the top microscopes 110 and 112. The alignment mark on the first wafer 50 is found, and the image of the alignment mark is digitized and is stored electronically. The first wafer 50 on the bottom bonding chuck 40 is then retracted, allowing the second wafer 52 on the top bonding chuck 44 to be brought into position. The second wafer 52 on the top bonding chuck 44 is then positioned to be viewed by the optical alignment measurement system 100. The second wafer 52 on the top bonding chuck 44 is then observed by the bottom microscopes 106 and 108 and is aligned to the existing digitized image of the alignment mark of the first wafer 50. The alignment may be performed by finely tuned translation of the top bonding chuck 44 in an X-direction and/or in a Y-direction and/or by finely tuned rotation of the top bonding chuck 44 around a Z-axis. The first wafer 50 on the bottom bonding chuck 40 with the first wafer 50 thereon is then moved back to its measured position. The optical alignment measurement system 100 may be calibrated prior to alignment to aid proper alignment.

Figure 9:
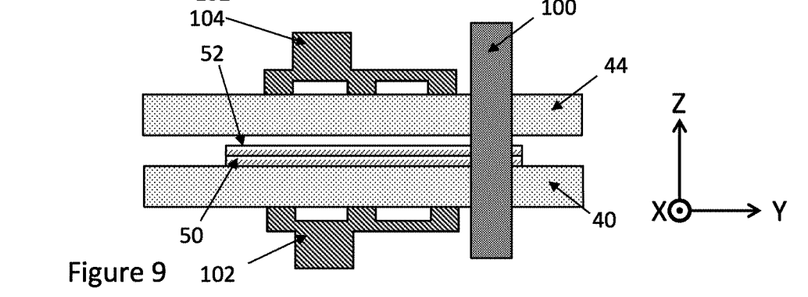

In FIG. 9, the first wafer 50 and the second wafer 52 are bonded. The bonding process may occur as described in FIGS. 2B and 2C. For example, the bonding pin 46 extends from the top bonding chuck 44 causing the second wafer 52 to deform and causing the bonding surfaces of the first wafer 50 and the second wafer 52 to contact. The first wafer 50 and the second wafer 52 first contact while the first wafer 50 is secured and conforms to the multi-curvature bonding surface 42 using the first vacuum system 102. Further, the first wafer 50 and the second wafer 52 first contact while the second wafer 52 is secured to the top bonding chuck 44 using the second vacuum system 104 and is deformed by the extension of and force from the bonding pin 46. Accordingly, the first wafer 50 and the second wafer 52 are initially contacted while both the first wafer 50 and the second wafer 52 are deformed, such as by an elastic deformation. The first wafer 50 and the second wafer 52 can be held in contact in this position for a period of time. The contacting portions of the first wafer 50 and the second wafer 52 may initiate bonding, such as through chemical reactions and/or atomic attractive forces. Once bonding is initiated, a bond wave may propagate between the bonding surfaces outwardly.

Then, the first vacuum system 102 is turned off such that the first wafer 50 is released from the bottom bonding chuck 40, and the second vacuum system 104 is turned off such that the second wafer 52 is released from the top bonding chuck 44. Once the first wafer 50 and the second wafer 52 are released, each of the first wafer 50 and the second wafer 52 may return to its natural form, such as a planar wafer. Additionally, the bond wave initiated may continue to propagate outwardly causing reactions and/or atomic attractive forces to occur between remaining portions of the bonding surfaces of the first wafer 50 and the second wafer 52. By contacting the bonding surfaces in generally center areas and having a bond wave propagate outwardly, voids and/or gas pockets can typically be avoided at the bonding interface between the bonding surfaces of the first wafer 50 and the second wafer 52.

The bonded first wafer 50 and second wafer 52 may then be clamped together to secure the first wafer 50 and second wafer 52 for transport. The robot assembly 96 may remove the bonded first wafer 50 and second wafer 52 from the bonding module 94 and transfer the bonded first wafer 50 and second wafer 52 to one of the first load port 82 or the second load port 84. The bonded first wafer 50 and second wafer 52 may then be transferred to another tool, such as to an annealing tool so that the bonded first wafer 50 and second wafer 52 may be annealed to increase a bond strength of the first wafer 50 and second wafer 52, for example.

Some embodiments may achieve advantages. By deforming a bottom wafer, such as the first wafer 50 as described above, during the initial contact during the bonding process, alignment of the bonded wafers may be increased. The deformation of the bottom wafer can expand or enlarge the bonding surface of the bottom wafer to correspond more to the expansion or enlargement of the top wafer when the bonding pin causes deformation of the top wafer. Hence, features of the bonded wafers can align more accurately, for example, to less than 0.3 µm. The improved bonding accuracy can increase yield, which can in turn decrease an overall cost of a product. Further, a multi-curvature bonding surface can be applied to any bonding tool to easily improve bonding accuracy without further tool, materials, or processes being required.

An embodiment is a method. The method includes loading a first wafer on first surface of a first bonding chuck, loading a second wafer on a second bonding chuck, and bonding the first wafer to the second wafer. The first surface is defined at least in part by a first portion of a first spherical surface and a second portion of a second spherical surface. The first spherical surface has a first radius, and the second spherical surface has a second radius. The first radius is less than the second radius.

Another embodiment is a method. The method includes securing a first wafer to a multi-curvature bonding surface of a first bonding chuck. The securing the first wafer causes the first wafer to deform. The method further includes securing a second wafer to a second bonding chuck, and while the second wafer is secured to the second bonding chuck, deforming the second wafer. While the second wafer is deformed and while the first wafer is deformed by the securing to the multi-curvature bonding surface, the second wafer is contacted with the first wafer. After the contacting the second wafer with the first wafer, the first wafer is released from the multi-curvature bonding surface, and the second wafer is released from the second bonding chuck.

A further embodiment is a tool. The tool includes a bonding module. The bonding module includes a first wafer bonding and a second wafer bonding chuck. The first wafer bonding chuck has a multi-curvature surface on which a first wafer is to be loaded. The multi-curvature surface is defined at least in part by a first portion of a first spherical surface and a second portion of a second spherical surface. The first spherical surface has a first radius, and the second spherical surface has a second radius. The first radius is different from the second radius. The second wafer bonding chuck has a second surface on which a second wafer is to be loaded.

A further embodiment is a tool. The tool includes a wafer bonding module. The wafer bonding module includes a first wafer bonding chuck and a second wafer bonding chuck. The first wafer bonding chuck has a multi-curvature surface on which a first wafer is to be loaded. The multi-curvature surface is defined at least in part by a first portion of a first spherical surface and a second portion of a second spherical surface. The first spherical surface has a first radius. The second spherical surface has a second radius. The first radius is different from the second radius. The second wafer bonding chuck has a second surface on which a second wafer is to be loaded. The first wafer bonding chuck and the second wafer bonding chuck are configured to be aligned with respect to one another.

A further embodiment is a tool. The tool includes a wafer bonding module. The wafer bonding module includes a first chuck and a second chuck. The first chuck has a first surface and a second surface opposite the first surface. The first surface is configured to accept a first wafer. The first surface includes a plurality of convex regions. A first center of curvature of a first convex region of the plurality of convex regions is closer to the second surface than a second center of curvature of a second convex region of the plurality of convex regions. The second chuck has a third surface. The third surface is configured to accept a second wafer to be bonded to the first wafer.

A further embodiment is a tool. The tool includes a wafer bonding module. The wafer bonding module includes a first chuck and a second chuck. The first chuck has a first surface. The first surface is configured to hold a first wafer. The first surface includes a plurality of concentric regions. Each of the plurality of concentric regions is a convex surface. A first curvature of a first concentric region of the plurality of concentric regions is greater than a second curvature of a second concentric region of the plurality of concentric regions. The second chuck has a second surface. The second surface is a planar surface. The second surface is configured to hold a second wafer to be bonded to the first wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A tool comprising:
a wafer bonding module comprising:
a first wafer bonding chuck having a multi-curvature surface on which a first wafer is to be loaded, the multi-curvature surface being defined at least in part by a first portion of a first spherical surface and a second portion of a second spherical surface, the first spherical surface having a first radius, the second spherical surface having a second radius, the first radius being different from the second radius; and
a second wafer bonding chuck having a second surface on which a second wafer is to be loaded, the first wafer bonding chuck and the second wafer bonding chuck being configured to be aligned with respect to one another.

2. The tool of claim 1, wherein the first wafer bonding chuck comprises a first vacuum system configured to secure the first wafer that is to be loaded on the first wafer bonding chuck, and the second wafer bonding chuck comprises a second vacuum system configured to secure the second wafer that is to be loaded on the second wafer bonding chuck.

3. The tool of claim 1, wherein the second wafer bonding chuck comprises a bonding pin configured to retract into the second wafer bonding chuck and to extend from the second surface of the second wafer bonding chuck.

4. The tool of claim 1, wherein the first radius is less than the second radius.

5. The tool of claim 1, wherein the first portion of the first spherical surface is in a central region of the multi-curvature surface, the second portion of the second spherical surface being around the central region of the multi-curvature surface.

6. The tool of claim 1, wherein the wafer bonding module further comprises an alignment system.

7. A tool comprising:
a wafer bonding module comprising:
a first chuck having a first surface and a second surface opposite the first surface, the first surface being configured to accept a first wafer, wherein the first surface comprises a plurality of convex regions, and wherein a first center of curvature of a first convex region of the plurality of convex regions is closer to the second surface than a second center of curvature of a second convex region of the plurality of convex regions; and
a second chuck having a third surface, the third surface being configured to accept a second wafer to be bonded to the first wafer.

8. The tool of claim 7, wherein the first convex region comprises a portion of a first spherical surface, and wherein the second convex region comprises a portion of a second spherical surface.

9. The tool of claim 8, wherein a first radius of the first spherical surface is less than a second radius of the second spherical surface.

10. The tool of claim 9, wherein the first radius is about 90 m, and wherein the second radius is about 200 m.

11. The tool of claim 7, wherein the first chuck comprises a first vacuum system configured to secure the first wafer to the first surface of the first chuck, and wherein the second chuck comprises a second vacuum system configured to secure the second wafer to the third surface of the second chuck.

12. The tool of claim 7, wherein the wafer bonding module further comprises an alignment system configured to align the first wafer to the second wafer.

13. The tool of claim 7, wherein the second chuck comprises a pin configured to extend from the third surface of the second chuck toward the first surface of the first chuck and deform the second wafer.

14. A tool comprising:
a wafer bonding module comprising:
a first chuck having a first surface, the first surface being configured to hold a first wafer, wherein the first surface comprises a plurality of concentric regions, wherein each of the plurality of concentric regions is a convex surface, and wherein a first curvature of a first concentric region of the plurality of concentric regions is greater than a second curvature of a second concentric region of the plurality of concentric regions; and
a second chuck having a second surface, the second surface being a planar surface, the second surface being configured to hold a second wafer to be bonded to the first wafer.

15. The tool of claim 14, wherein the first concentric region is a first portion of a first spherical surface, and wherein the second concentric region is a second portion of a second spherical surface.

16. The tool of claim 15, wherein the first spherical surface has a first radius of about 90 m, and wherein the second spherical surface has a second radius of about 200 m.

17. The tool of claim 15, wherein a first center of the first spherical surface is closer to a third surface of the first chuck than a second center of the second spherical surface, the third surface of the first chuck being opposite the first surface of the first chuck.

18. The tool of claim 14, wherein the second concentric region surrounds the first concentric region.

19. The tool of claim 14, wherein the first chuck comprises a first vacuum system disposed on a third surface of the first chuck, the third surface of the first chuck being opposite the first surface of the first chuck, the first vacuum system being configured to secure the first wafer to the first surface of the first chuck.

20. The tool of claim 14, wherein the second chuck comprises a second vacuum system disposed on a fourth surface of the second chuck, the fourth surface of the second chuck being opposite the second surface of the second chuck, the second vacuum system being configured to secure the second wafer to the second surface of the second chuck.

* * * * *